(12) United States Patent
Tokitoh (10) Patent No.: US 7,560,378 B2
(45) Date of Patent: Jul. 14, 2009

(54) METHOD FOR MANUFACTURING SEMICONDUCTOR DEVICE

(75) Inventor: Shunichi Tokitoh, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 170 days.

(21) Appl. No.: 11/501,691

(22) Filed: Aug. 10, 2006

(65) Prior Publication Data

US 2007/0042590 A1 Feb. 22, 2007

(30) Foreign Application Priority Data

Aug. 18, 2005 (JP) .............................. 2005-237137

(51) Int. Cl.
*H01L 21/20* (2006.01)
(52) U.S. Cl. ...................... 438/626; 438/633; 438/638; 438/675; 438/687; 438/724; 257/E21.252; 257/E21.262; 257/E21.576; 257/E21.578; 257/E23.145
(58) Field of Classification Search ................. 438/637, 438/643, 626, 633, 638, 675, 687, 724, 738, 438/740; 257/E21.252, 262, 576–579, 583, 257/598, E23.145
See application file for complete search history.

(56) References Cited

U.S. PATENT DOCUMENTS

| 6,080,529 A | * | 6/2000 | Ye et al. ...................... 430/318 |
| 6,091,148 A | * | 7/2000 | Givens et al. ................ 257/750 |
| 6,440,844 B1 | * | 8/2002 | Takagi et al. ................. 438/637 |
| 6,610,608 B1 | * | 8/2003 | Okada et al. ................. 438/724 |
| 6,818,995 B2 | * | 11/2004 | Masuda ....................... 257/758 |
| 7,323,407 B2 | * | 1/2008 | Lee et al. ..................... 438/623 |
| 2001/0004550 A1 | * | 6/2001 | Passemard ................... 438/618 |
| 2003/0129826 A1 | * | 7/2003 | Werkhoven et al. ......... 438/627 |
| 2004/0087101 A1 | * | 5/2004 | Balakumar et al. .......... 438/396 |
| 2004/0127023 A1 | * | 7/2004 | Chun .......................... 438/653 |

FOREIGN PATENT DOCUMENTS

JP 2003-31577 1/2003

* cited by examiner

*Primary Examiner*—Michael S Lebentritt
(74) *Attorney, Agent, or Firm*—Volentine & Whitt, P.L.L.C.

(57) ABSTRACT

A diffusion barrier film, a second insulating film, and a cap film are sequentially laminated on a first insulating film over a substrate. A wiring trench portion is formed extending therethrough to the first insulating film, assuming that the ratio of a width of the wiring trench portion in a direction orthogonal to its extending direction to a height of the wiring trench portion is 2.8 times even at a maximum. A barrier metal film is formed to cover the cap film and the wiring trench portion. A wiring film is deposited to cover the barrier metal film. The wiring film and the barrier metal film are chipped away until the surface of the cap film is exposed from the surface of the wiring film, thereby to form a wiring portion which buries the wiring trench portion.

14 Claims, 4 Drawing Sheets

METHOD FOR MANUFACTURING SEMICONDUCTOR DEVICE

BACKGROUND OF THE INVENTION

The present invention relates to a method for manufacturing a semiconductor device, and particularly to a so-called damascene method for forming a copper wiring.

With improvements in the degree of integration and performance of each element employed in a recent semiconductor device, there has been a demand for miniaturization of wiring per se and further minimization of a wiring interval. With the progress of miniaturization in a manufacturing process, a wiring delay has rate-controlled an operating speed. Therefore, a copper wiring (forming) technique using a wiring material as copper (Cu) lower in resistance or a copper alloy has been developed. It is difficult to process copper (alloy) used as for the wiring material by an etching technique. Accordingly, a manufacturing method called "a so-called damascene method" has been adopted.

Described specifically, this damascene method is a method for forming wiring trenches in an insulating film, depositing a copper alloy thin film that buries the wiring trenches and thereafter polishing or grinding the copper alloy thin film from its upper side thereby to allow only portions for burying the wiring trenches to remain and form embedded wirings. A CMP (Chemical Mechanical Polishing) method is generally applied to the process of polishing such a copper alloy thin film.

With further progress toward miniaturization, the occurrence of so-called dishing becomes a problem in such a copper alloy technique. The dishing means a step formed by denting a wiring surface in a concave form.

The dishing occurs particularly in wiring difficult to make further reductions in wiring length, wiring width and wiring depth (thickness) even by the development of miniaturization of a wiring forming process as in the case of, for example, global wirings which function as, for example, a power supply wiring and a clock signal line. The occurrence of such dishing will cause a problem such as an increase in wiring resistance.

There has been disclosed a configuration wherein the thickness of a copper film to be deposited is set to 1.6 to 2.0 times the depth of a wiring trench with a view toward suppressing the occurrence of dishing by a CMP process (refer to, for example, a patent document 1 (Japanese Unexamined Patent Publication No. 2003-31577)).

According to the configuration disclosed in the patent document 1, however, there is a need to form the thickness of the copper (alloy) thin film thicker in order to prevent the so-called dishing. Accordingly, a problem arises in that the time required to perform the process of forming the copper alloy thin film and the polishing time required to carry out the process of polishing or grinding the copper alloy thin film increase, thus resulting in a reduction in throughput of a manufactured semiconductor device.

There has therefore been a desire for a technique for more efficiently forming wiring relatively large particularly in wiring width and wiring thickness, such as global wirings which function as, for example, a power supply wiring and a clock signal line, while preventing the dishing.

SUMMARY OF THE INVENTION

The present invention has been made in view of the foregoing problems. It is therefore an object of the present invention to provide a method for manufacturing a semiconductor device, which is capable of preventing dishing at the formation of copper wiring.

According to one aspect of the present invention, for achieving the above object, there is provided a method for manufacturing a semiconductor device, comprising the following steps:

A semiconductor substrate having an upper surface and a lower surface opposite to the upper surface is prepared. Next, a first insulating film is formed on the upper surface of the semiconductor substrate.

Then, a diffusion barrier film that covers over the surface of the first insulating film, a second insulating film that covers over the diffusion barrier film, and a cap film that covers over the second insulating film are sequentially laminated.

Further, wiring trench portions extending through the diffusion barrier film, the second insulating film and the cap film are formed assuming that the ratio of a width of the wiring trench portion in the direction orthogonal to an extending direction of the wiring trench portion to a height extending from a bottom face of the wiring trench portion to a surface of the cap film is 2.8 times even at a maximum.

Next, a barrier metal film is formed which covers the surface of the cap film and the surfaces of the wiring trench portions.

Then, a wiring film is grown which buries the wiring trench portions with the barrier metal film deposited thereon and covers over the barrier metal film.

Further, the wiring film and the barrier metal film are chipped away until the surface of the cap film is exposed from the surface of the wiring film to thereby form barrier metals which cover the surfaces of the wiring trench portions, and wiring portions which bury the wiring trench portions provided with the barrier metals.

According to the semiconductor device manufacturing method of the present invention, a wiring film can be formed more evenly at its deposition stage. It is therefore possible to efficiently form wiring relatively large in wiring width and wiring thickness, like, for example, a global wiring while the occurrence of dishing is being prevented.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings. Incidentally, the shape, size and physical relationship of each constituent element or component in the figures are merely approximate illustrations to enable an understanding of the present invention. Therefore; the present invention is not limited only to examples illustrated in particular.

Although the specific materials, conditions and numerical conditions or the like might be used in the following description, they are no more than one of preferred examples. Accordingly, the present invention is by no means limited to these preferred examples.

Further, it is to be understood that similar constituent elements illustrated in the respective figures used in the following description are given the same reference numerals, and their dual explanations might be omitted.

(Method for Manufacturing Semiconductor Device)

A method for manufacturing a semiconductor device, according to the present invention will be explained with reference to FIGS. 1 and 2. Incidentally, so-called global wiring, which exists in the top or uppermost wiring layer of a semiconductor device (semiconductor chip) to be manufactured and has a length of such an extent as to cross over the upper surface of the semiconductor chip, will now be explained while being focused thereon.

Figure 1A:
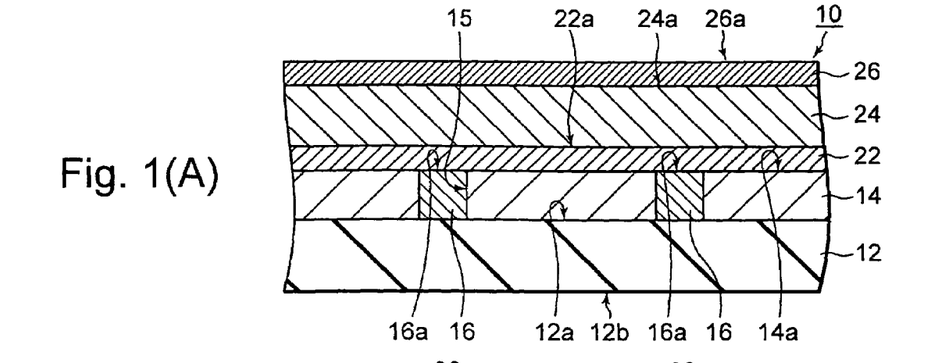
FIGS. 1(A), 1(B) and 1(C) are respectively fragmentary schematic views showing cut sections of a semiconductor device being in process of its manufacture to describe a manufacturing process.
Figure 1B:
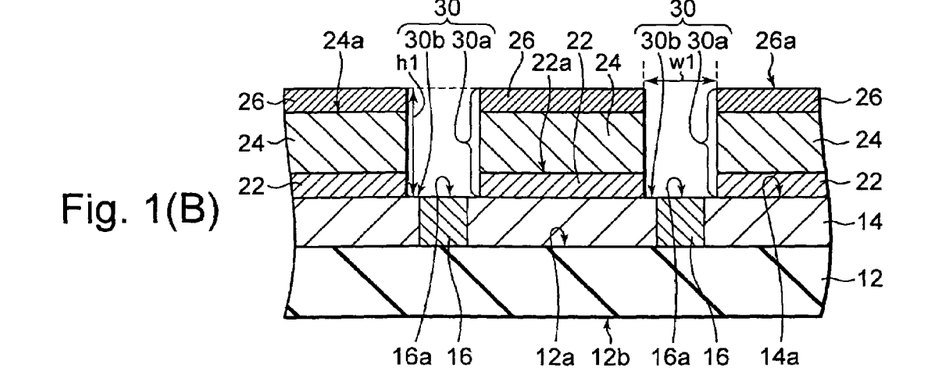
Figure 1C:
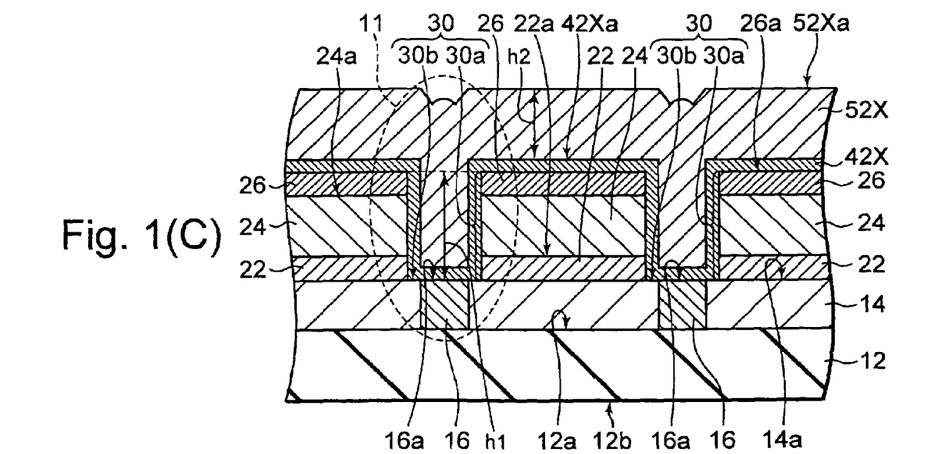

FIGS. 1(A), 1(B) and 1(C) are respectively fragmentary schematic views showing cut sections of the semiconductor device being in process of its manufacture to explain a manufacturing process.

Figure 2A:
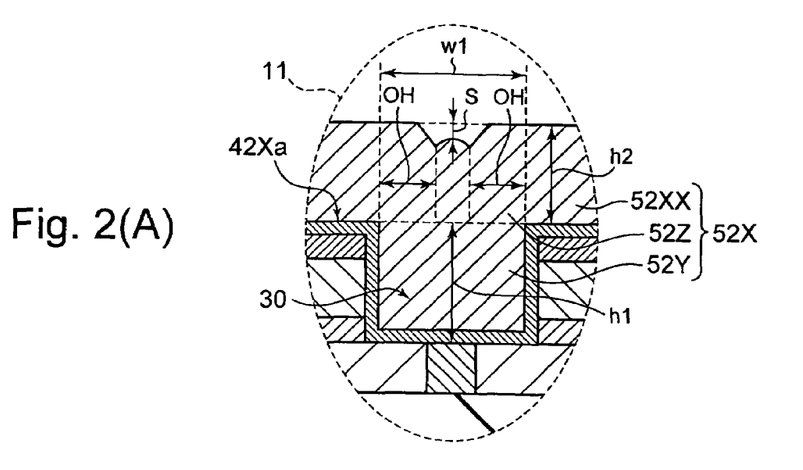
FIGS. 2(A) and 2(B) are respectively schematic views following FIG. 1.
Figure 2B:
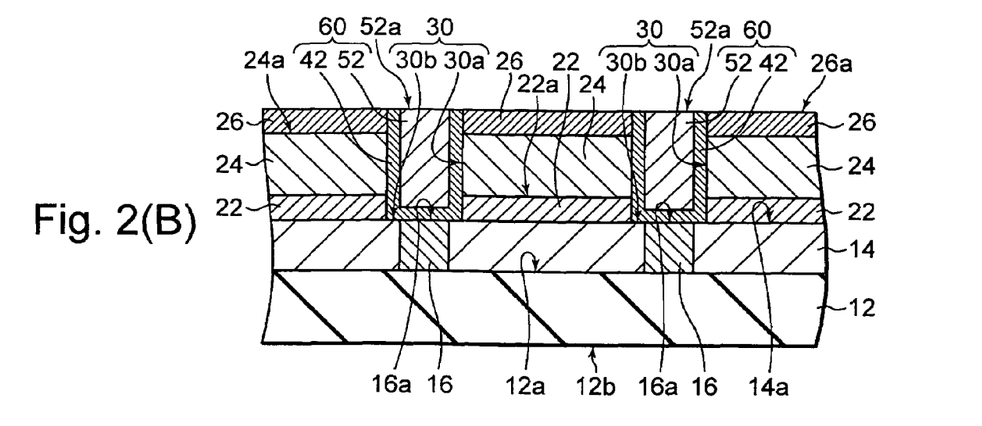

FIGS. 2(A) and 2(B) are schematic views following FIG. 1.

As shown in FIG. 1(A), a semiconductor substrate 12 corresponding to, for example, a silicon wafer is first prepared. The semiconductor substrate 12 has an upper surface 12a and a lower surface 12b opposite to the upper surface 12a. An unillustrated chip area configured as a semiconductor chip is set to the semiconductor substrate 12.

Next, elements such as transistors, etc. are built to the upper surface 12a side of the semiconductor substrate 12 on the basis of a design layout using an arbitrary suitable process known to date (not shown).

Then, a first insulating film 14 is formed over the entire upper surface 12a so as to cover the elements. The first insulating film 14 is a silicon oxide film, for example. The first insulating film 14 is formed by a conventionally known deposition or growth method like a CVD method under an arbitrary suitable condition.

Further, contact holes 15, which reach the elements through the first insulating film 14, are defined in the first insulating film 14 lying within a chip area. The contact holes 15 may be formed by a series of processes: a conventionally known resist coating process, a process for forming a resist pattern by a photolithography process, and an etching process using such a resist pattern as a mask.

Next, embedded contacts 16, which bury the contact holes 15, are formed. The embedded contacts 16 are constituted by burying the contact holes 15 using a conductive material such as tungsten (W) in accordance with a conventionally known method such as a CVD method. Further, the embedded contacts 16 may be formed by carrying out an etchback process. Owing to this etchback process, a top face 16a of each embedded contact 16 becomes substantially the same height as that of a surface 14a of the first insulating film 14.

Next, as shown in FIG. 1(A), a diffusion barrier film 22 is formed on the surface 14a of the first insulating film 14 and the top face 16a of each embedded contact 16. The diffusion barrier film 22 is of a film used as a wiring material and used for preventing the diffusion of copper, which will be described later. As the diffusion barrier film 22, for example, a silicon nitride film or a silicon carbide (SiC) film may be grown under an arbitrary suitable condition by the CVD method or the like known to date.

Further, a second insulating film 24 is formed on a surface 22a of the diffusion barrier film 22. As the second insulating film 24, for example, a silicon oxide film may be formed under an arbitrary suitable condition by the CVD method or the like known to date.

A problem about a signal delay due to an increase in the parasitic capacitance of an insulating film that buries between adjacent wirings, is becoming increasingly serious in the recent copper wiring technique.

Thus, the second insulating film 24 may preferably be formed as a low-permittivity film low in dielectric constant as compared with the silicon oxide film. Described specifically, the process of forming the second insulating film 24 may preferably be set as a process for depositing or growing a low-permittivity film (Low-k film) known to date, whose dielectric constant ranges from, preferably 1.5 to 3.0, for example, a material like HSQ (hydrogen silsesquioxane), MSQ (methyl silsesquioxane) or CDO (carbon doped oxide), or a polymer material like SiLK (registered trademark) produced by Dow Chemical Co., Ltd., or a silicon oxide film under an arbitrary suitable condition. This deposition process may be carried out by, for example, the coating method or CVD method known to date. The thickness of the second insulating film 24 may preferably range from 100 nm to 5000 nm.

Further, a cap film 26 is formed on a surface 24a of the second insulating film 24 (refer to FIG. 1(A)). The cap film 26 mentioned here is a film which brings about the function of protecting the low-permittivity film. Described specifically, for example, a high-density silicon oxide film may be grown under an arbitrary suitable condition by a plasma CVD method known to date.

Next, wiring trench portions 30 each of which extends from a surface 26a of the cap film 26 to the surface 14a of the first insulating film 14 through the cap film 26, the second insulating film 24 and the diffusion barrier film 22, are formed. The wiring trench portion 30 is formed so as to expose the top face 16a of each embedded contact 16 (refer to FIG. 1(B)).

The wiring trench portion 30 has side wall portions 30a and a bottom face portion 30b. The side wall portions 30a are constituted in such a manner that openings or apertures respectively defined in the cap film 26, the second insulating film 24 and the diffusion barrier film 22 communicate with one another. The bottom face portion 30b includes partial areas of the surface 14a of the first insulating film 14, which expose the top face 16a of the embedded contact 16.

The wiring trench portions 30 may be formed as desired patterns by patterning the respective films in accordance with the photolithography process known to date and the etching process placed under arbitrary suitable conditions corresponding to the materials constituting the cap 26, the second insulating film 24 and the diffusion barrier film 22.

Each of the wiring trench portions 30 of the present invention is characterized in that a trench width w1 extending in the direction orthogonal to the direction (longitudinal direction, i.e., the direction orthogonal to the sheet of FIG. 1(B) here) in which the wiring trench portion 30 extends, is determined on the basis of a depth (height) h1 of the wiring trench portion 30, which is defined by the sum of thicknesses of the cap film 26, the second insulating film 24 and the diffusion barrier film 22. Although the details thereof will be described later, the wiring trench portion 30 may preferably be formed in such a manner that the trench width w1 becomes less than or equal to, preferably, 2.8 times the depth h1 specifically.

As shown in FIG. 1(C), a barrier metal film 42X is formed which covers the surface 26a of the cap film 26, and the interiors of the wiring trench portions 30, i.e., the side wall portions 30a and the exposed top faces 16a of the embedded contacts 16. As the barrier metal film 42X, for example, a tantalum (Ta) film can be applied. The thickness of the barrier metal film 42X is set as a thickness corresponding to so-called technology nodes. The barrier metal film 42X is deposited a thickness of 30 nm or so by PVD method in the case of a 90 nm node, for example. If the formation of a wiring film to be described later, which buries the wiring trench portions, is taken into consideration, then the barrier metal film 42X may preferably be formed on the surface 26a of the cap film 26 and the side wall portions 30a and bottom face portions 30b of the wiring trench portions 30 in a substantially uniform thickness.

The barrier metal film 42X may be formed by a conventionally known arbitrary suitable process corresponding to the selected material.

Next, the wiring film 52X comprised of a copper alloy, which buries the barrier metal film 42X from above, that is, which buries the wiring trench portions 30 covered with the barrier metal film 42X, is formed (hereinafter also expressed simply as "burying wiring trench portions 30") (refer to FIG. 1(C)).

The process of forming the wiring film 52X may preferably be carried out in accordance with a two-stage process. Described specifically, the first stage is that a film comprised of a copper alloy is first deposited over the entire exposed surface within, preferably, a film-thickness range from 20 nm to 150 nm by a PVD method known to date. Next, the second stage is that the wiring film 52X for burying the wiring trench portions 30 is formed by, preferably, an electrolytic plating method, a CVD method or an electroless plating method known to date.

The thickness of the wiring film 52X, i.e., a thickness h2 lying on the side above a surface 42Xa of the barrier metal film 42X lying outside each wiring trench portion 30 can be grown as a thickness ranging from 0.9 to 1.5 times the depth h1, i.e., a thickness thinner than conventional on the basis of the trench depth h1 of the wiring trench portion 30.

The aspect or form of the wiring film 52X that buries the wiring trench portions 30 will now be explained with reference to FIG. 2(A).

FIG. 2(A) is a schematic partly enlarged view showing a partial area 11 of FIG. 1(C) in an enlarged form.

As described above, the trench width w1 of the wiring trench portion 30 is set so as to be less than or equal to 2.8 times the trench depth h1. Thus, if the trench width w1 is defined to the width up to 2.8 times the trench depth h1, then the wiring film can be efficiently embedded into the wiring trench portions 30 even by the copper alloy deposition process that complies with the above-described method known per se in the art.

A lower limit of the ratio of the trench width w1 of each wiring trench portion 30 to its trench depth h1 can be set to an arbitrary suitable one on the condition that the embedding of the wiring material into the wiring trench portions 30 can be satisfactorily performed without the occurrence of so-called voids or seams. At the mention of the deposition process of the present situation, the lower limit of the trench width w1 to the trench depth h1 of each wiring trench portion 30 may preferably be set to, for example, 0.2 or so in terms of embeddability.

As shown in FIG. 2(A), the wiring film 52X has a portion 52Z having a concave portion at its surface or having no concave portion, which is provided on the upper side of a portion 52Y which buries the corresponding wiring trench portion 30. The portion 52Z is a portion surrounded by a portion 52XX formed on a surface 42Xa placed out of the wiring trench portion 30 or stuck therein. Thus, it can be said that the above portion 52Z apparently protrudes toward the side above the wiring trench portion 30 as seen from the portion 52XX. Therefore, the 52Z portion is also referred to as "overhang portions OH". In other words, if a trench width w1 is defined with a trench depth h1 as the reference, then part of the deposited wiring film 52X extends out just above the wiring trench portion 30 to form overhang portions OH. When the surfaces of the overhang portions OH are provided as flat surfaces continuously connected with the upper surface of the portion 52XX and formed directly above the wiring film 52X that buries the wiring trench portion 30, a step or steplike offset S does not substantially exist in the surface of the wiring film 52X. Since the step S is an extremely small step even though a dent (step S) is formed in the overhang portions OH, any obstacle does not occur practically. That is, the wiring film 52X that buries the wiring trench portions 30 can be more evenly formed as a whole.

As a result, the thickness h2 of the wiring film 52X can be made thinner than conventional. Described specifically, the thickness h2 having needed 1.5 to 1.8 times or more so far with the trench depth h1 as the reference can be reduced up to 0.9 to 1.5 times or so.

Then, heat treatment (called also "anneal process") is performed under an arbitrary suitable condition to promote crystallization of the wiring film 52X formed of the copper alloy.

Next, as shown in FIG. 2(B), a CMP process is effected to polish or grind the wiring film 52X until the surface 26a of the cap film 26 is exposed, whereby wiring structural portions 60 are formed in which the wiring trench portions 30 covered with their corresponding barrier metals 42 are embedded therein and the positions of the surfaces 52a substantially match with the surface 26a of the cap film 26.

This CMP process may preferably be executed on condition that, for example, a polishing rate is large and the flatness of a surface to be polished or ground can be ensured.

As the polishing condition, specifically, preferably, polishing pressure may be set to a range from 13.8 kPa (Kilopascals) to 31.0 kPa (2.0 psi to 4.5 psi) and the velocity of a polishing pad (polishing surface) relative to the wiring film 52X may be set to a range from 60 m/min to 180 m/min. Next, the surface to be polished is cleaned up.

Incidentally, although the present example has shown that the semiconductor device manufacturing method of the present invention is applied to set the suitable wiring as the wiring formed as the wiring (first wiring layer) at the top or uppermost surface via each embedded contact, the manufacturing method of the present invention can of course be applied even to wiring difficult to make a wiring length, a wiring width and a wiring depth (thickness) smaller, which wiring functions as each of, for example, power supply wiring and a clock signal line included in respective wiring layers employed in a multilayered wiring structure including a plurality of wiring layers.

Thus, if the trench width w1 is defined with the trench depth h1 as the reference, then the wiring film 52X can be formed flatter at its deposition stage. Accordingly, the formation of the wiring structural portions 60 according to the CMP process can be performed while the occurrence of dishing is being prevented.

Since the thickness h2 of the wiring film 52X can be reduced thinner than conventional, the amount of use of the material for the wiring film 52X can be decreased. Since the thickness h2 can be set thinner, the time required to perform the CMP process can be shortened. As a result, a high-quality semiconductor device free of dishing can be manufactured efficiently and at good yields.

MODIFICATION

A modification of the semiconductor device manufacturing method will next be explained with reference to FIGS. 3 and 4.

Figure 3A:
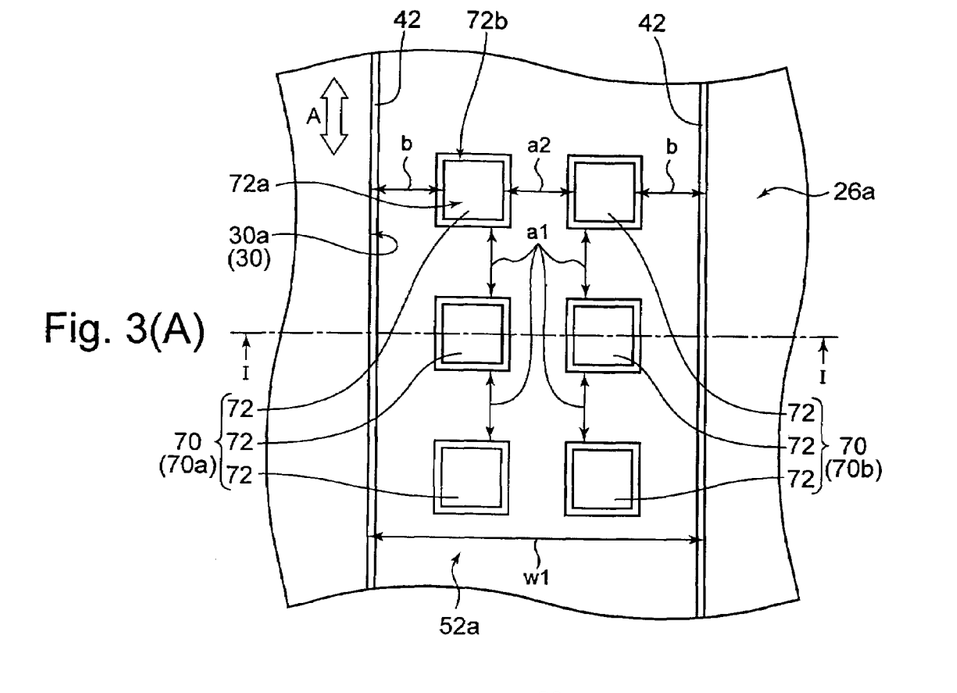
FIG. 3(A) is a planar fragmentary schematic view of a semiconductor device for describing a manufacturing process of a modification.
Figure 3B:
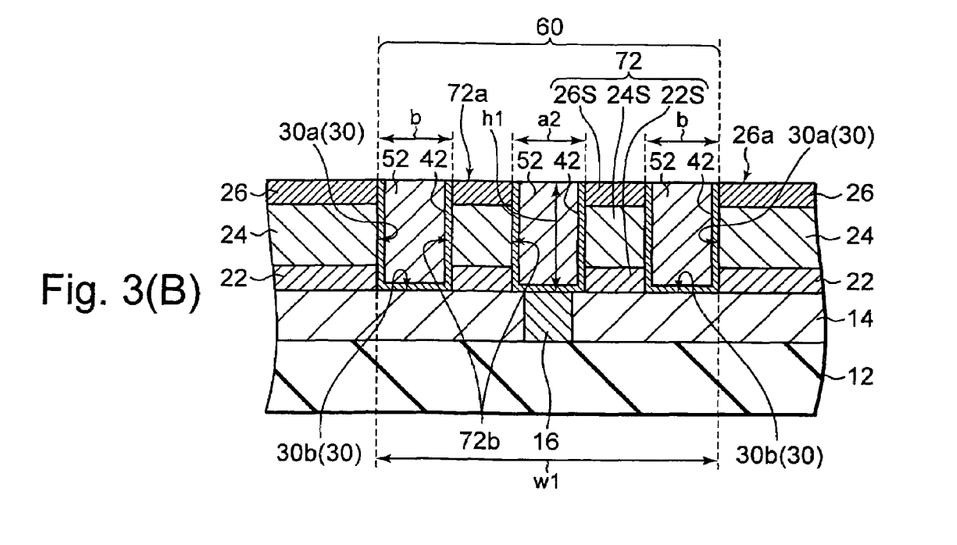
FIG. 3(B) is a schematic view illustrating a section cut along dashed line I-I' in FIG. 3(A)
Figure 4:
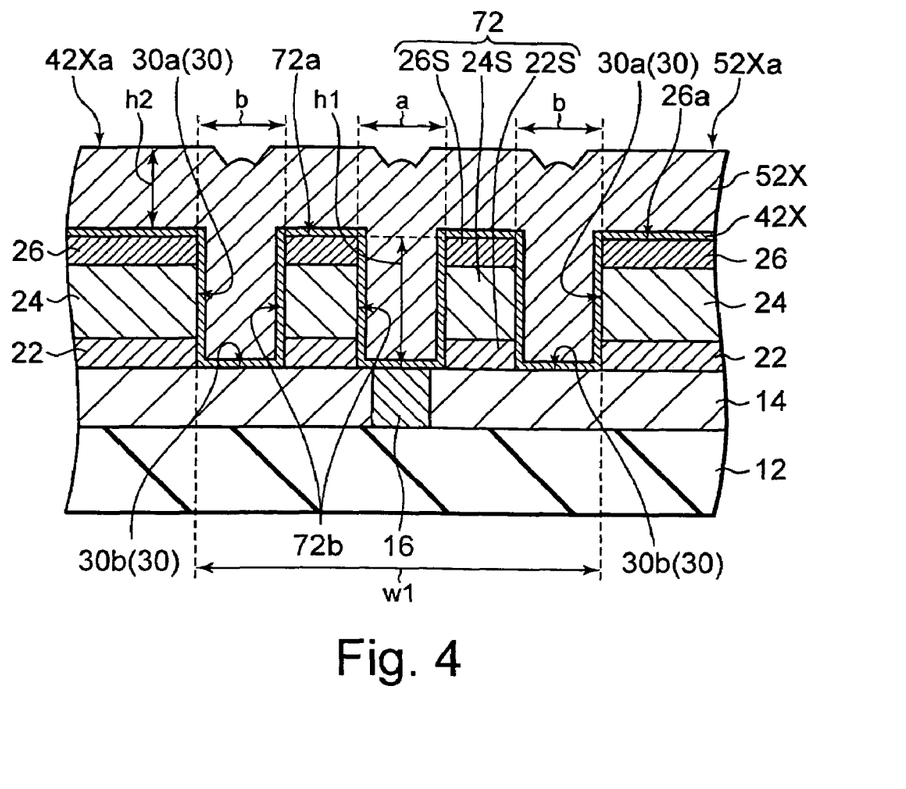
FIG. 4 is a schematic view for explaining a method for manufacturing the modification.

FIGS. 3 and 4 are schematic views for describing the manufacturing method showing the modification. FIG. 3(A) is a planar fragmentary schematic view of a semiconductor device for describing a manufacturing process. FIG. 3(B) and FIG. 4 are respectively schematic views each illustrating a section cut along dashed line I-I' in FIG. 3(A).

The present example is a configurational example in which a wiring width w1 cannot be fit into a width up to 2.8 times as large as a trench width h1 due to circumstances such as capacitance, etc.

The semiconductor device manufacturing method according to the present example is characterized in that an insulative columnar body (also called "SLOT") is formed. Incidentally, since the materials for respective layers are similar to the already-described examples, their detailed explanations will be omitted.

In a manner similar to the above-described example, up to the processes for sequentially laminating a diffusion barrier film 22, a second insulating film 24 and a cap film 26 are executed.

Next, a wiring trench portion 30 is formed which reaches a surface 14a of a first insulating film 14 through the diffusion barrier film 22, the second insulating film 24 and the cap film 26. The corresponding wiring trench portion 3b is formed so as to expose a top face 16a of an embedded contact 16. The wiring trench portion 30 includes side wall portions 30a and a bottom face portion 30b. The side wall portions 30a are configured such that openings or apertures respectively defined in the cap film 26, the second insulating film 24 and the diffusion barrier film 22 communicate with one another. The bottom face portion 30b includes a partial area of the surface 14a of the first insulating film 14, which exposes the top face 16a of the embedded contact 16.

The wiring trench portion 30 may be formed as a desired pattern by patterning the respective films in accordance with a conventionally known photolithography process and an etching process under arbitrary suitable conditions corresponding to the materials constituting the cap film 26, the second insulating film 24 and the diffusion barrier film 22.

In the present example, a trench width of the wiring trench portion 30, i.e., its wiring width w1 is greater than or equal to 2.8 times its trench depth h1.

Upon forming such a wide wiring trench portion 30, a plurality of island-shaped insulative columnar bodies 72 are formed simultaneously in the present example.

Described specifically, the insulative columnar bodies 72 can be formed by, upon patterning the cap film 26, the second insulating film 24 and the diffusion barrier film 22 in accordance with the etching process, protecting the same by, for example, resist masks that cover areas in which the insulative columnar bodies 72 are formed.

That is, the formed insulative columnar bodies 72 respectively have configurations in which columnar body portions 22S each corresponding to part of the diffusion barrier film 22, columnar body portions 24S each corresponding to part of the second insulating film 24, and columnar body portions 26S each corresponding to part of the cap film 26, all of which remain after the completion of the etching process, are sequentially laminated.

Incidentally, although the illustrated example has shown the example in which the flat form as seen from the upper surface side is shaped in the form of a square pole corresponding to the square, the flat shape can be set to arbitrary suitable shapes such as a rectangular shape, a circular shape, etc. The size (volume) of the insulative columnar body 72, which is defined according to the area of the flat shape, can be set to an arbitrary suitable one.

Each columnar body row 70 includes a plurality of the insulative columnar bodies 72. At this time, the intervals a1 among the plurality of adjacent insulative columnar bodies 72 of the columnar body row 70 are made equal to one another. The columnar body rows 70 are provided in an array form along the direction indicated by an open double-headed array A in FIG. 3(A), in which the wiring trench portion 30 (wiring portion and wiring structure) extends. At this time, the columnar body rows 70 are formed in such a manner that the distance between the side wall portion 30a of the wiring trench portion 30 and its corresponding side surface 72b of the insulative columnar body 72, which are spaced away from each other, becomes a predetermined interval b.

The present example shows an example in which the two columnar body rows 70, i.e., a first row 70a and a second row 70b are formed. At this time, the first row 70a and the second row 70b are respectively formed in such a manner that the distances among the opposite side surfaces (72b) of the insulative columnar bodies 72 included in the first and second rows 70a and 70b, which are spaced away from one another, i.e., the spaced distances as seen in the direction of the trench width of the wiring trench portion 30 respectively become a predetermined interval a2.

These intervals a1, a2 and b are defined on the basis of the trench depth h1 of the wiring trench portion 30. Described specifically, the insulative columnar bodies 72 may be formed assuming that the intervals a1, a2 and b are respectively set to 2.8 times the trench depth h1 even at the maximum.

As shown in FIG. 4, a barrier metal film 42X is formed which covers a surface 26a of the cap film 26 and the interior of the wiring trench portion 30, i.e., the side wall portions 30a, the top face 16a of the embedded contact 16, the exposed surfaces 14a of the first insulating film 24, and the entire exposed surfaces of the insulative columnar bodies 72, i.e., their top faces 72a and side surfaces 72b.

Next, a wiring film 52X made up of a copper alloy is formed which covers over the barrier metal film 42X, i.e., buries the wiring trench portion 30 covered with the barrier metal film 42X and the insulative columnar bodies 72.

As described above, the intervals a1, a2 and b are respectively set so as to be less than or equal to 2.8 times the trench depth h1. If the intervals a1, a2 and b are respectively defined to a width up to 2.8 times the trench depth h1 in this way, then the interior of the wiring trench portion 30 including the intervals designated at symbols a1, a2 and b can be buried efficiently even by the copper-alloy deposition process that complies with the method known per se in the art.

If the intervals a1, a2 and b are respectively defined with the trench depth h1 as the reference, then parts of the deposited wiring film 52X extend out directly above the wiring trench portion 30 to form overhang portions OH (not shown and refer to FIG. 2(A) and the corresponding above description). Forming the overhang portions makes it possible to avoid substantial existence of steps in the wiring film 52X or extremely reduce the same. That is, it is possible to more evenly form the wiring film 52X that buries the wiring trench portion 30 provided with the insulative columnar bodies 72.

As a result, the thickness h2 of the wiring film 52X can be made thinner than conventional. Described specifically, the thickness h2 having needed 1.5 to 1.8 times or more so far with the trench depth h1 as the reference can be reduced up to 0.9 to 1.5 times or so.

Then, heat treatment is performed under an arbitrary suitable condition to promote crystallization of the wiring film 52X formed of the copper alloy.

Next, a CMP process is effected under a condition similar to the above to polish or grind the wiring film 52X until the surface 26a of the cap film 26 is exposed, whereby the insulative columnar bodies 72 whose side surfaces 72b are covered with their corresponding barrier metals 42, and wiring structural portions 60 having wiring portions 52 that bury the wiring trench portion 30, are formed.

Incidentally, although the present example has explained the example in which the columnar body rows 70 corresponding to the two rows are formed within the wiring trench portion 30, the columnar body row 70 can be formed as only one row where the intervals a1 and b are less than or equal to 2.8 times the trench depth h1. Columnar body rows 70 corresponding to three rows or more can also be formed on the condition that the intervals a1, a2 and b are respectively 2.8 times or less the trench depth h1.

If the intervals a1, a2 and b related to the insulative columnar bodies 72 are defined on the basis of the trench depth h1 in this way, then the wiring film 52X can be formed flatter at its deposition stage. Thus, even when a larger wiring width is required, the formation of the wiring structural portions 60 according to the CMP process can be carried out while the occurrence of dishing is being prevented.

Since the thickness h2 of the wiring film 52X can be reduced thinner than conventional, the amount of use of the material for the wiring film 52X can be decreased. Since the thickness h2 can be set thinner, the time required to perform the CMP process can be shortened. As a result, a high-quality semiconductor device free of dishing can be manufactured efficiently and at good yields.

While the preferred forms of the present invention have been described, it is to be understood that modifications will be apparent to those skilled in the art without departing from the spirit of the invention. The scope of the invention is to be determined solely by the following claims.

What is claimed is:

1. A method for manufacturing a semiconductor device, comprising:
    preparing a semiconductor substrate having an upper surface and a lower surface opposite to the upper surface;
    forming a first insulating film over the upper surface of the semiconductor substrate;
    sequentially laminating a diffusion barrier film covering a surface of the first insulating film, a second insulating film covering the diffusion barrier film, and a cap film covering the second insulating film;
    forming wiring trench portions extending through the diffusion barrier film, the second insulating film and the cap film, a ratio of 1) a width of the wiring trench portions in a direction orthogonal to a lengthwise extending direction of the wiring trench portions, to 2) a height extending from a bottom face of the wiring trench portions to an uppermost surface of the cap film is defined as not greater than 2.8;
    forming a barrier metal film which covers the uppermost surface of the cap film and surfaces within the wiring trench portions;
    depositing a wiring film on the barrier metal film to bury the wiring trench portions and cover the barrier metal film; and
    chipping away the wiring film and the barrier metal film until the uppermost surface of the cap film is exposed, so that the wiring film and the barrier metal film remain buried in the wiring trench portions,
    wherein said depositing a wiring film comprises growing the wiring film on the uppermost surface of the cap film as having a thickness ranging from 0.9 to 1.5 times a depth of the wiring trench portions.

2. The method according to claim 1, wherein said forming wiring trench portions comprises forming the wiring trench portions as extending through the diffusion barrier film, the second insulating film and the cap film and as having one or more columnar body rows in the wiring trench portions,
    each of the columnar body rows including a plurality of insulative columnar bodies arranged and provided within the wiring trench portions along the lengthwise extending direction of the wiring trench portions, a ratio between 1) a height equivalent to a height from the bottom face of the wiring trench portions to the uppermost surface of the cap film of the insulative columnar bodies, and 2) a first distance as along a width direction of the wiring trench portions between a side wall portion of the wiring trench portions and a side surface of each of the insulative columnar bodies, or a ratio between 1) the height of the insulative columnar bodies, and 2) a second distance as along the width direction between adjacent insulative columnar bodies, and a ratio between 1) the height of the insulative columnar bodies, and 2) a third distance between the side wall portion of the wiring trench portions and the side surface of each of the insulative columnar bodies are set to not greater than 2.8,
    wherein said forming a barrier metal film comprises forming the barrier metal film as covering the surfaces within the wiring trench portions and including the uppermost surface of the cap film, a top face of an embedded contact within the first insulating film, the surface of the first insulating film and entire surfaces of the insulative columnar bodies, and
    wherein said depositing a wiring film comprises depositing the wiring film to bury the wiring trench portions having the barrier metal film therein and to cover the barrier metal film, and
    wherein said chipping comprises chipping away the wiring film and the barrier metal film until the uppermost surfaces of the cap film on the insulative columnar bodies are exposed, so that the wiring film and the barrier metal film remain buried in the wiring trench portions between the insulative columnar bodies.

3. The method according to claim 2, wherein said forming wiring trench portions comprises allowing respective parts of the diffusion barrier film, the second insulating film and the cap film as sequentially laminated to sequentially remain as island-shaped columnar body portions, to thereby form the wiring trench portions in conjunction with the insulative columnar bodies.

4. The method according to any one of claims 1, 2 and 3, wherein the second insulating film is formed as a low-permittivity film having a dielectric constant ranging from 1.5 to 3.0.

5. A method for manufacturing a semiconductor device comprising:
providing a substrate with a first insulating layer thereon;
sequentially laminating a diffusion barrier film on the first insulating layer, a second insulating layer on the diffusion barrier film, and a cap film on the second insulating layer;
forming a trench through the cap film, the second insulating layer and the diffusion barrier film to expose a surface of the first insulating layer, a ratio of a width of the trench with respect to a depth of the trench is not greater than 2.8;
forming a barrier metal film conformally within the trench and on an uppermost surface of the cap film;
depositing a wiring film on the barrier metal film within the trench to bury the trench and on the barrier metal film over the uppermost surface of the cap film, wherein the wiring film over the upper surface of the cap film has a thickness within a range of 0.9 to 1.5 the depth of the trench; and
removing the wiring film and the barrier metal film above the uppermost surface of the cap film so that the uppermost surface of the cap film is exposed and the wiring film remains buried within the trench.

6. The method for manufacturing a semiconductor device of claim 5, further comprising forming an embedded contact within the first insulating layer, the embedded contact aligned with the trench and having the barrier metal film thereon.

7. The method for manufacturing a semiconductor device of claim 5, wherein the diffusion barrier film is silicon nitride or silicon carbide.

8. The method for manufacturing a semiconductor device of claim 5, wherein the trench is formed to include a plurality of insulative columnar bodies therein during said forming a trench, the insulative columnar bodies each having a height equivalent to the depth of the trench and each formed of laminated sections of the diffusion barrier film, the first insulating layer and the cap film.

9. The method for manufacturing a semiconductor device of claim 8, wherein the insulative columnar bodies are formed to be square-shaped.

10. The method for manufacturing a semiconductor device of claim 8, wherein the insulative columnar bodies are formed to be circular-shaped.

11. The method for manufacturing a semiconductor device of claim 8, wherein the insulative columnar bodies are disposed within the trench in an array.

12. The method for manufacturing a semiconductor device of claim 8, wherein the insulative columnar bodies are disposed within the trench so that distances between neighboring ones of the insulative columnar bodies are set to be not greater than 2.8 times the depth of the trench.

13. The method for manufacturing a semiconductor device of claim 8, wherein the insulative columnar bodies are disposed within the trench so that distances between sidewalls of the trench and the insulative columnar bodies immediately adjacent the sidewalls of the trench are set to be not greater than 2.8 times the depth of the trench.

14. The method for manufacturing a semiconductor device of claim 8, wherein the insulative columnar bodies are disposed within the trench so that distances between neighboring ones of the insulative columnar bodies are set to be not greater than 2.8 times the depth of the trench, and so that distances between sidewalls of the trench and the insulative columnar bodies immediately adjacent the sidewalls of the trench are set to be not greater than 2.8 times the depth of the trench.

* * * * *